(12) United States Patent
Willett

(10) Patent No.: US 11,720,263 B2
(45) Date of Patent: Aug. 8, 2023

(54) ARRANGEMENT OF MEMORY CELLS FOR A QUANTUM-COMPUTING DEVICE

(71) Applicant: Nokia Technologies Oy, Espoo (FI)

(72) Inventor: Robert L. Willett, Warren, NJ (US)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 17/288,458

(22) PCT Filed: Oct. 22, 2019

(86) PCT No.: PCT/IB2019/059015
§ 371 (c)(1),
(2) Date: Apr. 23, 2021

(87) PCT Pub. No.: WO2020/084489
PCT Pub. Date: Apr. 30, 2020

(65) Prior Publication Data
US 2021/0247917 A1   Aug. 12, 2021

Related U.S. Application Data

(60) Provisional application No. 62/751,078, filed on Oct. 26, 2018.

(51) Int. Cl.
G06F 3/00 (2006.01)
G06F 3/06 (2006.01)
G06N 10/00 (2022.01)

(52) U.S. Cl.
CPC .......... G06F 3/0629 (2013.01); G06F 3/0604 (2013.01); G06F 3/0673 (2013.01); G06N 10/00 (2019.01)

(58) Field of Classification Search
None
See application file for complete search history.

(56) References Cited

U.S. PATENT DOCUMENTS

| 8,324,120 B2 | 12/2012 | Baldwin et al. |
| 8,633,092 B2 | 1/2014 | Baldwin et al. |

(Continued)

FOREIGN PATENT DOCUMENTS

| WO | 2017027733 A1 | 2/2017 |
| WO | 2018063139 A1 | 4/2018 |
| WO | 2018125026 A1 | 7/2018 |

OTHER PUBLICATIONS

International Search Report and Written Opinion for corresponding International application No. PCT/IB2019/059015; dated Jan. 23, 2020 (12 pages).

(Continued)

*Primary Examiner* — Midys Rojas
(74) *Attorney, Agent, or Firm* — Mendelsohn Dunleavy, P.C.; Steve Mendelsohn

(57) ABSTRACT

An array of interconnected memory cells for storing therein a fractional-quantum-Hall-effect droplet whose state is controllable using voltages applied to the cell electrodes. In an example embodiment, the memory cells are arranged and linked together such as to reduce the geometric size of the array, e.g., compared to that of a linear array having the same number of memory cells. For example, one or more wheel-and-spokes arrangements of the memory cells can be used for this purpose. The smaller geometric size of the array can result in better coherence across the droplet confined therein, which can advantageously be used to improve the reliability and/or performance of the corresponding quantum-computing device.

13 Claims, 6 Drawing Sheets

(56) References Cited

U.S. PATENT DOCUMENTS

| | | | |
|---|---|---|---|
| 8,987,703 | B2 | 3/2015 | Willett |
| 9,286,154 | B2 | 3/2016 | Ashikhmin |
| 9,762,262 | B2 | 9/2017 | Ashikhmin |
| 10,002,328 | B1 | 6/2018 | Gamble, IV et al. |
| 2010/0155697 | A1 | 6/2010 | Baldwin et al. |
| 2012/0280208 | A1 | 11/2012 | Jain |
| 2013/0140523 | A1 | 6/2013 | Willett |
| 2018/0157986 | A1 | 6/2018 | Oxford et al. |
| 2018/0226451 | A1 | 8/2018 | Dzurak et al. |
| 2019/0341370 | A1* | 11/2019 | Keeth .................... G11C 5/063 |
| 2020/0135254 | A1 | 4/2020 | Willett |
| 2020/0328277 | A1* | 10/2020 | Jain .................... H01L 29/1054 |

OTHER PUBLICATIONS

Nickerson, Naomi H., et al. "Topological quantum computing with a very noisy network and local error rates approaching one percent." arXiv.org preprint, arXiv:1211.2217v3 (2012): 1-12.
Collins, G. P. "Computing with Quantum Knots." Scientific American 294.4 (Apr. 2006): 56-63.
Nayak, Chetan, et al. "Non-Abelian Anyons and Topological Quantum Computation." arXiv.org preprint, arXiv:0707.1889v2 (Jul. 2007): 1-73.
Notice of Reasons for Refusal for corresponding Japanese application No. 2021-522975; dated Aug. 2, 2022 (6 pages) Machine Translation.

* cited by examiner

ARRANGEMENT OF MEMORY CELLS FOR A QUANTUM-COMPUTING DEVICE

CROSS-REFERENCE TO RELATED APPLICATIONS

This application claims the benefit of U.S. Provisional Patent Application No. 62/751,078, filed on 26 Oct. 2018, and entitled "ARRANGEMENT OF MEMORY CELLS FOR A QUANTUM-COMPUTING DEVICE", which is incorporated, by reference, herein, in its entirety.

BACKGROUND

Field

Various example embodiments relate to quantum computing.

Description of the Related Art

This section introduces aspects that may help facilitate a better understanding of the disclosure. Accordingly, the statements of this section are to be read in this light and are not to be understood as admissions about what is in the prior art or what is not in the prior art.

Quantum-computing devices have been made or proposed based on various technologies, e.g., superconducting-junction devices, ion-trap devices, and fractional-quantum-Hall-effect (FQHE) devices. Quantum-computing devices typically use a memory to store a state and hardware for writing the state to the memory and for reading the state from the memory. Reliable methods for writing to the memory and reading from the memory are useful for various types of quantum-computing devices.

For example, FQHE states related to filling factors of 5/2 and 3/5 have been suggested as possibly being useful for quantum-computing devices. For some such states, interferometric devices have been suggested for defining the FQHE state, changing said state, and doing computation with said states. That is, an interferometric device can be used to write and read a quantum bit (often referred to as a qubit) and to enable interactions so that different qubits can be manipulated for quantum computation, e.g., in a quantum gate.

SUMMARY OF SOME SPECIFIC EMBODIMENTS

Disclosed herein are various embodiments of an array of interconnected memory cells for storing therein a fractional-quantum-Hall-effect droplet whose state is controllable using voltages applied to the cell electrodes. In an example embodiment, the memory cells are arranged and linked together such as to reduce the geometric size of the array, e.g., compared to that of a linear array having the same number of memory cells. For example, one or more wheel-and-spokes or star-like arrangements of the memory cells can be used for this purpose. The smaller geometric size of the array can result in better coherence across the droplet confined therein, which can advantageously be used to improve the reliability and/or performance of the corresponding quantum-computing device.

According to an example embodiment, provided is an apparatus comprising: a substrate having a semiconductor quantum-well structure along a planar surface of the substrate; a plurality of memory cells along said planar surface of the substrate, each of the memory cells having a first pattern of controllable electrodes on the planar surface of the substrate, the electrodes of the first pattern defining a sequence of three or more lateral regions of the semiconductor quantum-well structure joined by intra-cell channels; and one or more memory-cell linkers on the substrate, each of said one or more memory-cell linkers having a respective second pattern of controllable electrodes on the planar surface of the substrate to define selectable inter-cell channel connections of at least some of the memory cells; and wherein the electrodes of the first and second patterns are controllable to deplete lateral areas of the quantum-well structure of charge carriers such that a droplet of the charge carriers in the semiconductor quantum-well structure is localized laterally along the planar surface, with a respective portion of the droplet being localized in each of the three or more memory cells and in each of the one or more memory-cell linkers.

BRIEF DESCRIPTION OF THE DRAWINGS

Other aspects, features, and benefits of various disclosed embodiments will become more fully apparent, by way of example, from the following detailed description and the accompanying drawings, in which.

DETAILED DESCRIPTION

Some embodiments may benefit from at least some features disclosed in U.S. Pat. Nos. 8,324,120, 8,987,703, and 8,633,092 and in the article by Chetan Nayak, Steven H. Simon, Ady Stern, et al., "Non-Abelian Anyons and Topological Quantum Computation," Rev. Mod. Phys., 2008, v. 80, pp. 1083-1155, all of which are incorporated herein by reference in their entirety.

Herein, various memories for storing, reading, and manipulating qubits are based on a laterally confined droplet of a 2-dimensional (2D) charge-carrier gas (2DCCG), e.g., an electron or hole gas located in a quantum-well, which is maintained in a special FQHE state. Typically, the gas of charge carriers of the FQHE state is maintained to have a fixed filling factor, e.g., 5/2 12/5, or 3/5, of Landau level(s) for the laterally confined droplet of the 2D gas of charge carriers in a transverse magnetic field. The FQHE state is produced by subjecting the 2DCCG to a perpendicular magnetic field at a suitably low temperature, e.g., below 150 mK. The corresponding cooling system may include, e.g., a He-based dilution refrigerator. The magnetic-field strength can be about 5 Tesla or more, which can be generated in a conventional manner, e.g., using a superconducting magnet.

Figure 1:
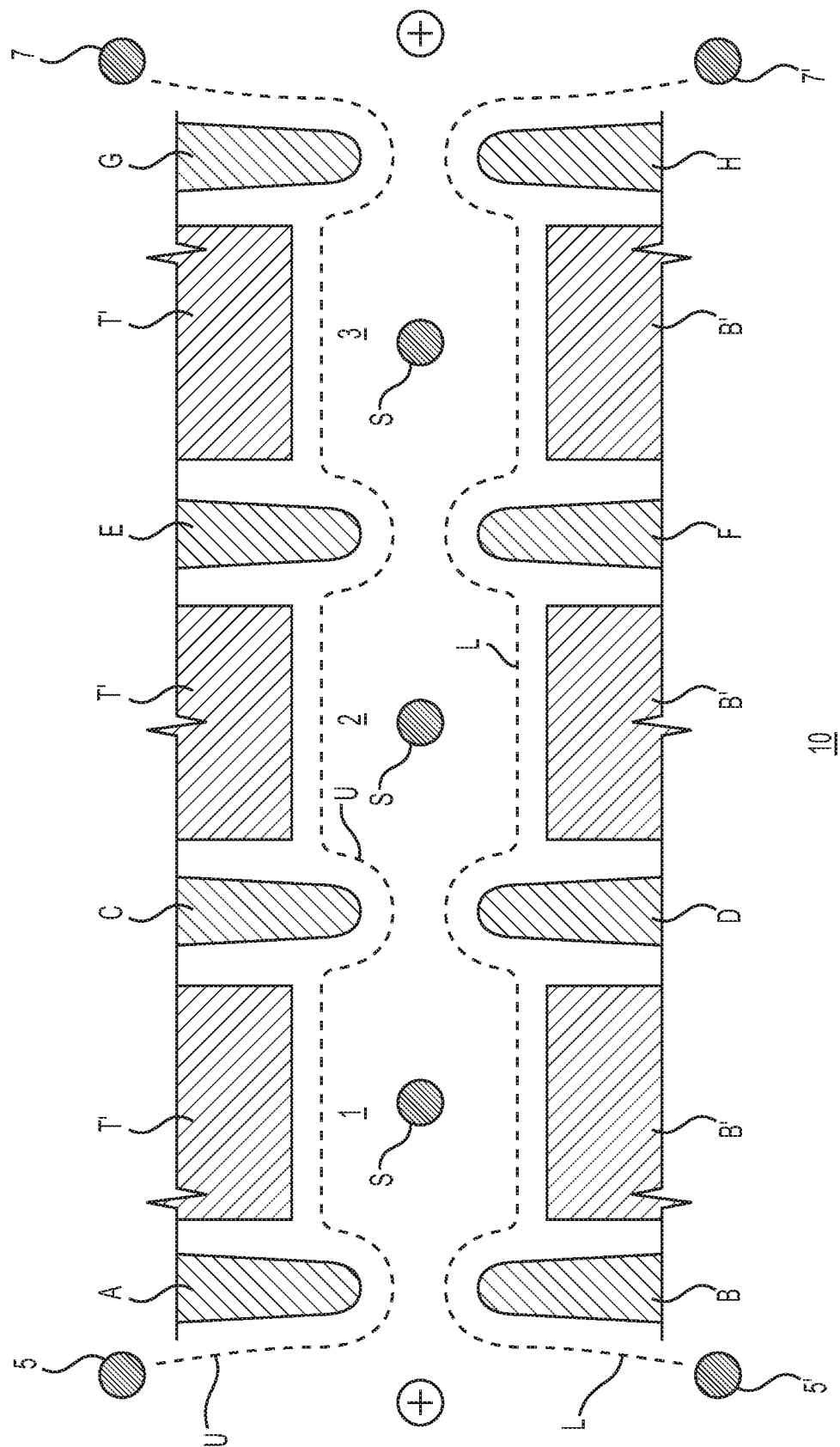
FIG. 1 shows a schematic top view of a memory cell for a single qubit based on the FQHE that can be used in a quantum-computing device according to an embodiment.
Figure 2:
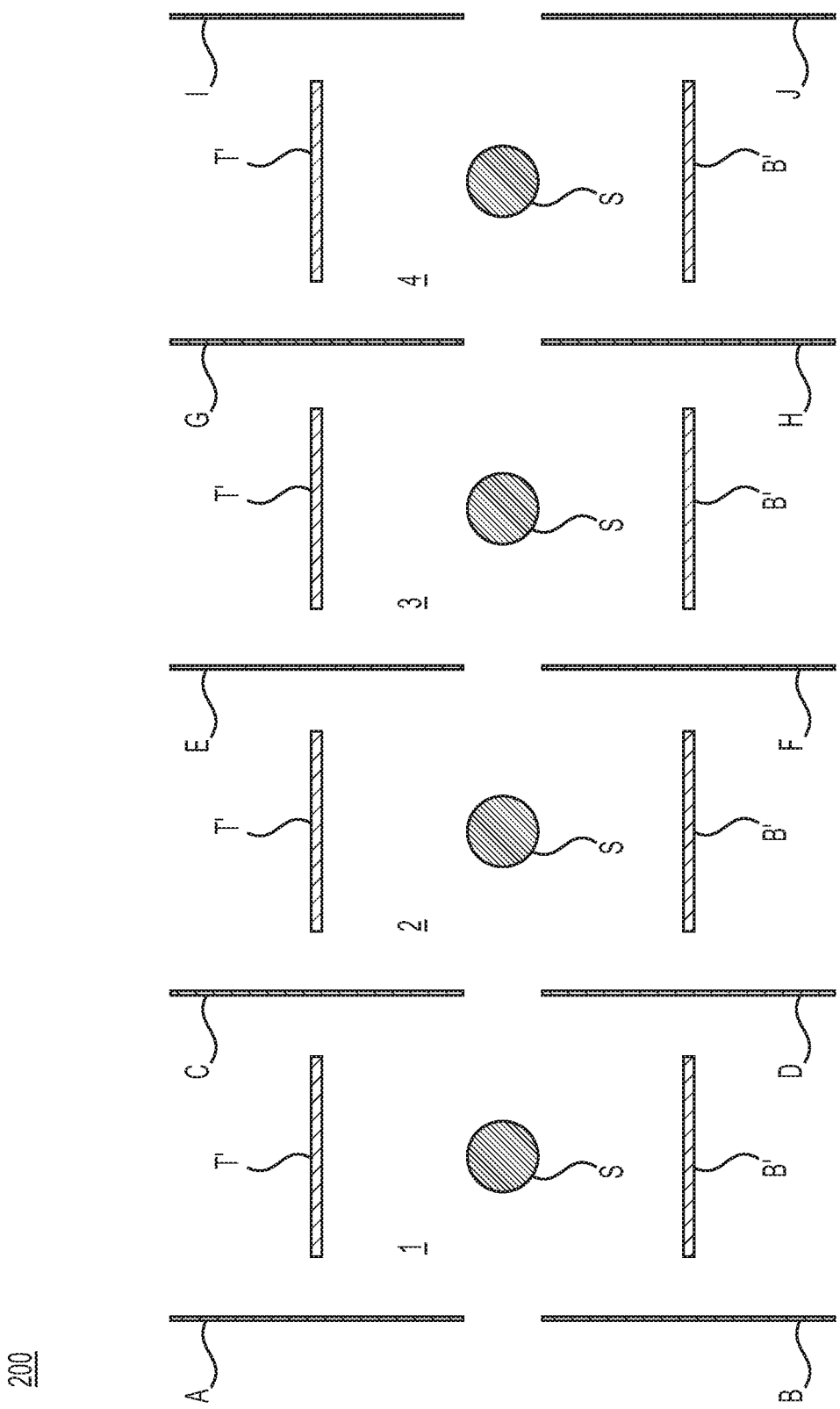
FIG. 2 shows a schematic diagram of a memory cell that can be used in a quantum-computing device according to another embodiment.

Below, FIGS. 1 and 2 illustrate examples of memory cells for storing, manipulating, and reading single qubits.

FIG. 1 shows a schematic top view of a memory cell 10 for a single qubit based on the FQHE that can be used in a quantum-computing device according to an embodiment. The memory cell 10 includes an electrode pattern (indicated in FIG. 1 by the hatched areas) on and/or over a top surface of a planar, semiconductor quantum-well structure. The top surface typically extends perpendicular to the stacking direction of the semiconductor layers in the planar, semiconductor quantum-well structure. Portions of the electrode pattern may be on the surface, and other portions of the electrode pattern may be near and over said surface, but are, for simplicity, shown in FIG. 1 as being on the top surface.

The planar, semiconductor quantum-well structure is configured to vertically trap a 2DCCG gas, e.g., an electron gas. For example, the planar, semiconductor quantum-well structure may have a 2D gallium nitride (GaN) well region vertically surrounded by aluminum gallium nitride (AlGaN) barrier layers and may have other layers carrying dopants to provide the charge carriers for the well region. The planar, semiconductor quantum-well structure may also have a more-complex multiple quantum-well structure to better screen defects related to charged dopant atoms, e.g., may include narrower screening quantum-wells surrounding the main quantum-well, and/or the planar, semiconductor quantum-well structure may be based on layers of different semiconductor alloys.

The above-cited U.S. Pat. Nos. 8,324,120, 8,987,703, and 8,633,092 describe examples of planar, semiconductor quantum-well structures that may be used in at least some embodiments.

In the memory cell 10, the electrode pattern is formed by a pattern of metal gates, which can be voltage biased to deplete areas below the electrode pattern of the 2DCCG gas and thereby provide lateral confinement of a 2D droplet of the 2DCCG gas between said electrodes. The upper and lower edges of said 2D droplet, labeled U and L, respectively, are shown by dashed lines in FIG. 1. In the memory cell 10, metal gates substantially laterally surround three separate lateral regions 1, 2, 3, which are used for storing and manipulating a single qubit.

In an alternative embodiment, additional metal gates can be used to substantially laterally surround more than three separate lateral regions analogous to the lateral regions 1, 2, 3. An example of such an alternative embodiment is described in more detail below in reference to FIG. 2.

In the embodiment shown in FIG. 1, the pattern of metal gates includes top electrodes T', bottom electrodes B', and channel electrodes A, B, C, D, E, F, G, and H.

In each of the three regions 1, 2, 3, the voltage biasing of the top and bottom electrodes T', B' and the channel electrodes A-H can be used to deplete the underlying and adjacent regions of charge carriers of the 2D gas thereby substantially defining the lateral extend of the droplet of the 2DCCG gas along the top surface of the planar, semiconductor quantum-well structure. Indeed, the biasing of said electrodes T', B' can often be changed to move the upper and lower edges U, L of said droplet of the 2DCCG gas. The horizontal boundaries of the lateral regions 1, 2, 3 are defined by the biasing of channel electrodes A-H, which have narrow channels between the facing pairs thereof. Notably, the voltage biasing of facing pairs (A, B), (C, D), (E, F), and (G, H) of said channel electrodes may be adjusted to narrow or widen one or more of the channels. Narrowing one of said channels enables edge excitations to tunnel between the upper U and lower L edges of the laterally confined droplet at said channel when the droplet is maintained in a substantially incompressible FQHE state. Also, charge can thus be enabled to tunnel between the U and L edges of the droplet.

In some embodiments, one or more small or point-like electrodes (not shown) may be located between each or some of the facing pairs of the channel electrodes, i.e., (A, B), (C, D), (E, F), and (G, H), to enable control of tunneling of charge and/or edge excitations therebetween. Said small or point-like electrodes may also be separately voltage biased to facilitate better control of said tunneling.

Each region 1, 2, 3 also has, at least one, small electrode S, e.g., a point-like or disk-shaped electrode at the interior thereof. Said small electrodes S may be in contact with or slightly above the top surface of the planar, semiconductor quantum-well structure. Said small electrodes S enable storage of specific excitations of appropriate FQHE states in the adjacent set of regions 1, 2, 3 through the application of appropriate voltage biasing.

The above-cited U.S. Pat. Nos. 8,324,120, 8,987,703, and 8,633,092 describe example patterns of electrodes that may be useful in some embodiments to cause a corresponding 2DCCG gas to be in an appropriate FQHE state.

The memory cell 10 may further include a left pair of measurement electrodes (5, 5') and a right pair of measurement electrodes (7, 7') that can be used to measure currents carried between the upper and lower edges U, L of the droplet of the 2DCCG gas at the respective left and right sides of the memory cell 10. Said measurement electrodes 5, 5', 7, 7' may have various suitable shapes and locations.

In some other embodiments, a memory cell for a single qubit may include, at least, four separate regions for laterally confining a portion of the droplet of the 2DCCG gas along the top surface of the corresponding planar, semiconductor quantum-well structure. Each of the four or more separate regions typically includes respective top and bottom electrodes T', B' for controlling the upper and lower edges U, L of the droplet by voltage biasing as already described in reference to regions 1, 2, 3 shown in FIG. 1. Each of the four or more separate regions has respective channels at opposite sides thereof, and each channel is controlled by a respective facing pair of channel electrodes, e.g., similar to the facing pairs (A, B), (C, D), (E, F), and (G, H) of FIG. 1. For the four or more regions, portions of the droplet of the 2DCCG gas, in adjacent ones of the regions, are connected by the channel between said adjacent regions. Also, each of the four or more regions may include, in the interior thereof, a respective small electrode, e.g., similar to electrodes S of FIG. 1, which may be charged.

Example methods of operating the memory cell 10 are described in U.S. Provisional Patent Application No. 62/751,253, filed on Oct. 26, 2018, and entitled "KEY-BASED MULTI-QUBIT MEMORY," which is incorporated herein, by reference, in its entirety. Based on the disclosure of the present application, a person of ordinary skill in the relevant arts will be able to adapt those methods for operating memory cells having four or more separate regions for laterally confining a portion of the droplet of the 2DCCG gas without any undue experimentation.

FIG. 2 shows a schematic diagram of a memory cell 200 for a single qubit based on the FQHE that can be used in a quantum-computing device according to another embodiment. More specifically, the schematic diagram of FIG. 2 schematically represents a top view of memory cell 200 that is analogous to the top view shown in FIG. 1.

Memory cell 200 differs from memory cell 10 (FIG. 1) in that memory cell 200 includes four separate regions, labeled 1-4, respectively, for laterally confining portions of the droplet of the 2DCCG gas along the top surface of the corresponding planar, semiconductor quantum-well structure. Memory cell 200 can be constructed, e.g., by adding the lateral region 4 and the corresponding electrodes T', B', I, J, and S to the memory cell 10 (FIG. 1). Similar to memory cell 10, memory cell 200 can be configured to support a single qubit.

For example, the regions 1 and 2 of memory cell 200 can be configured to support a first topological quantum state, e.g., |0>. The regions 3 and 4 of memory cell 200 can similarly be configured to support a second topological quantum state, e.g., |1>. The first and second topological quantum states can be entangled such that, together, the regions 1-4 can support a superposed quantum state, $|m>=\alpha|0>+\beta|1>$, wherein (i) the filling factor of 5/2 is continuous throughout the regions 1-4 and (ii) the charges can move coherently along the upper U and lower L edges of the droplet laterally confined within the regions 1-4 (also see FIG. 1).

Figure 3:
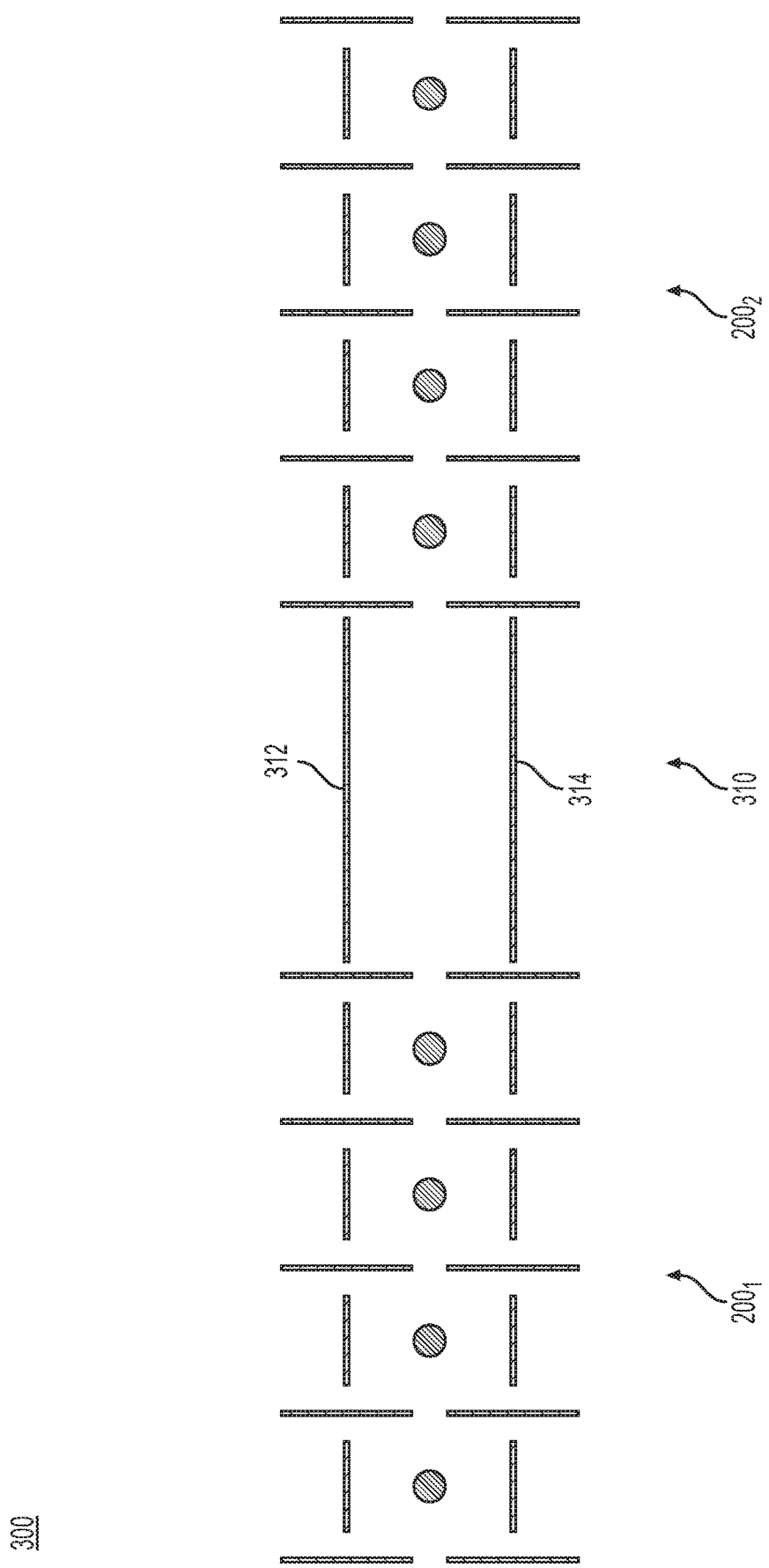
FIG. 3 shows a schematic diagram of a memory-cell array having a plurality of memory cells of FIG. 2 linked together according to an embodiment.

Below, FIG. 3 illustrates an example arrangement of coupled memory cells for storing, manipulating, and reading multiple qubits. The arrangement is a sequence, e.g., a linear array of single-qubit memory-cells.

FIG. 3 shows a schematic diagram of a memory-cell array 300 according to an embodiment. Array 300 comprises two memory cells 200 (FIG. 2), which are labeled in FIG. 3 using the reference numerals $200_1$ and $200_2$, respectively. Array 300 further comprises a linker 310 that connects memory cells $200_1$ and $200_2$ such that (i) the filling factor of 5/2 is continuous throughout memory cells $200_1$ and $200_2$ and linker 310 and (ii) the charges can move coherently along the edges of the 2DCCG droplet laterally confined within memory cells $200_1$ and $200_2$ and linker 310.

In an example embodiment, linker 310 can be implemented using (i) a quantum-well structure similar to that of memory cell 200 and (ii) electrodes 312 and 314 configured to laterally confine the portion of the 2DCCG droplet located in the linker. Electrodes 312 and 314 can be similar, e.g., to top electrode T' and bottom electrode B', respectively, of memory cell 10 or 200. Due to the presence of linker 310, the qubits $|m_1>$ and $|m_2>$ supported in memory cells $200_1$ and $200_2$, respectively, can be entangled such that array 300 can support an entangled quantum state, $|M>=\gamma|m_1>+\delta|m_2>$.

A person of ordinary skill in the art will understand that array 300 can be extended, e.g., by using one or more additional instances (nominal copies) of linker 310 to link together, in a linear geometric arrangement, more than two memory cells 200. For certain numbers of cells 200 linked in this manner, the resulting linear array may be used to provide reliable entanglement and manipulation of the qubits supported in the linked cells. However, as the number of linked cells 200 increases, the resulting larger linear size of the corresponding linear array may cause, e.g., some loss of coherence across the 2DCCG droplet, thereby degrading the reliability and/or performance of the corresponding bigger array.

This and possibly other related problems in the state of the art can be addressed, e.g., using at least some embodiments described in more detail below in reference to FIGS. 4-6. In an example embodiment, a plurality of memory cells 200 are arranged and linked together such as to reduce the geometric size of the resulting array, e.g., compared to that of a linear array having the same number of memory cells 200. Advantageously, the smaller geometric size of the corresponding array can result in better coherence across the entire 2DCCG droplet confined therein, which can be used to improve the reliability and/or performance of the corresponding memory as a quantum-computing device.

Figure 4:
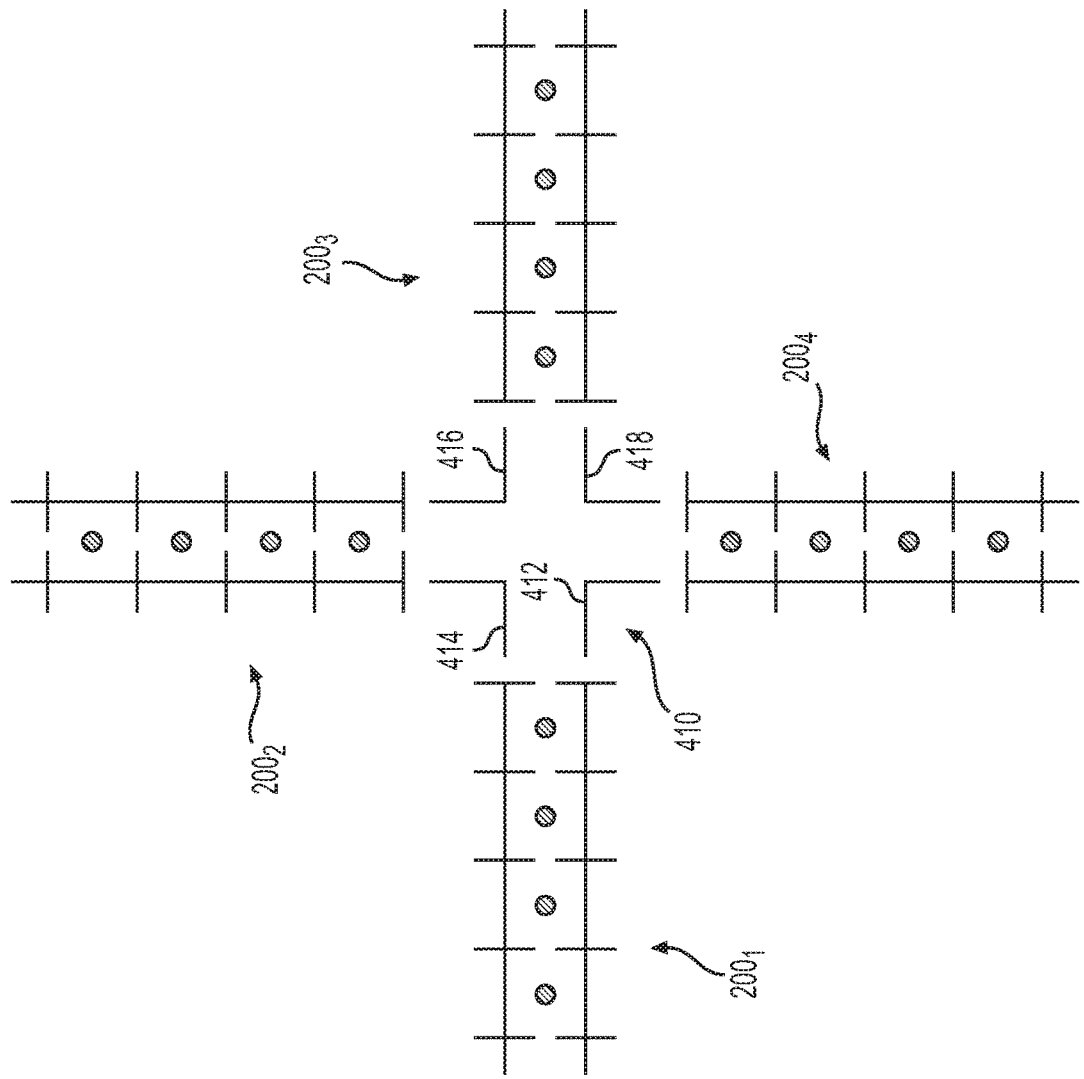
FIG. 4 shows a schematic diagram of a memory-cell array having a plurality of memory cells of FIG. 2 linked together according to another embodiment.

FIG. 4 shows a schematic diagram of a memory-cell array 400 according to another embodiment. Array 400 comprises four memory cells 200 (FIG. 2), which are labeled in FIG. 4 using the reference numerals $200_1$-$200_4$, respectively. Array 400 further comprises a linker 410 that connects memory cells $200_1$-$200_4$ such that (i) the filling factor of 5/2 is continuous throughout memory cells $200_1$-$200_4$ and linker 410 and (ii) the charges can move coherently along the edges of the 2DCCG droplet laterally confined within memory cells $200_1$-$200_4$ and linker 410.

In an example embodiment, linker 410 can be implemented using (i) a quantum-well structure similar to that of memory cell 200 and (ii) electrodes 412-418 configured to laterally confine the portion of the 2DCCG droplet located in the linker. Electrodes 412-418 can be similar, e.g., to electrodes T' and/or B' of memory cell 10 or 200. Due to the presence of linker 410, the qubits $|m_1>, \ldots, |m_4>$ supported in memory cells $200_1$-$200_4$, respectively, can be entangled such that array 400 can support the corresponding entangled quantum state.

The geometric arrangement of memory cells $200_1$-$200_4$ and linker 410 in array 400 can be illustratively analogized to a four-spoke wheel, wherein linker 410 is geometrically similar to the wheel's axle, and memory cells $200_1$-$200_4$ are geometrically similar to the wheel's four spokes that extend out from the axle along the radii of the wheel. The angle between two neighboring memory cells 200 in this geometric arrangement is approximately 90 degrees.

Figure 5:
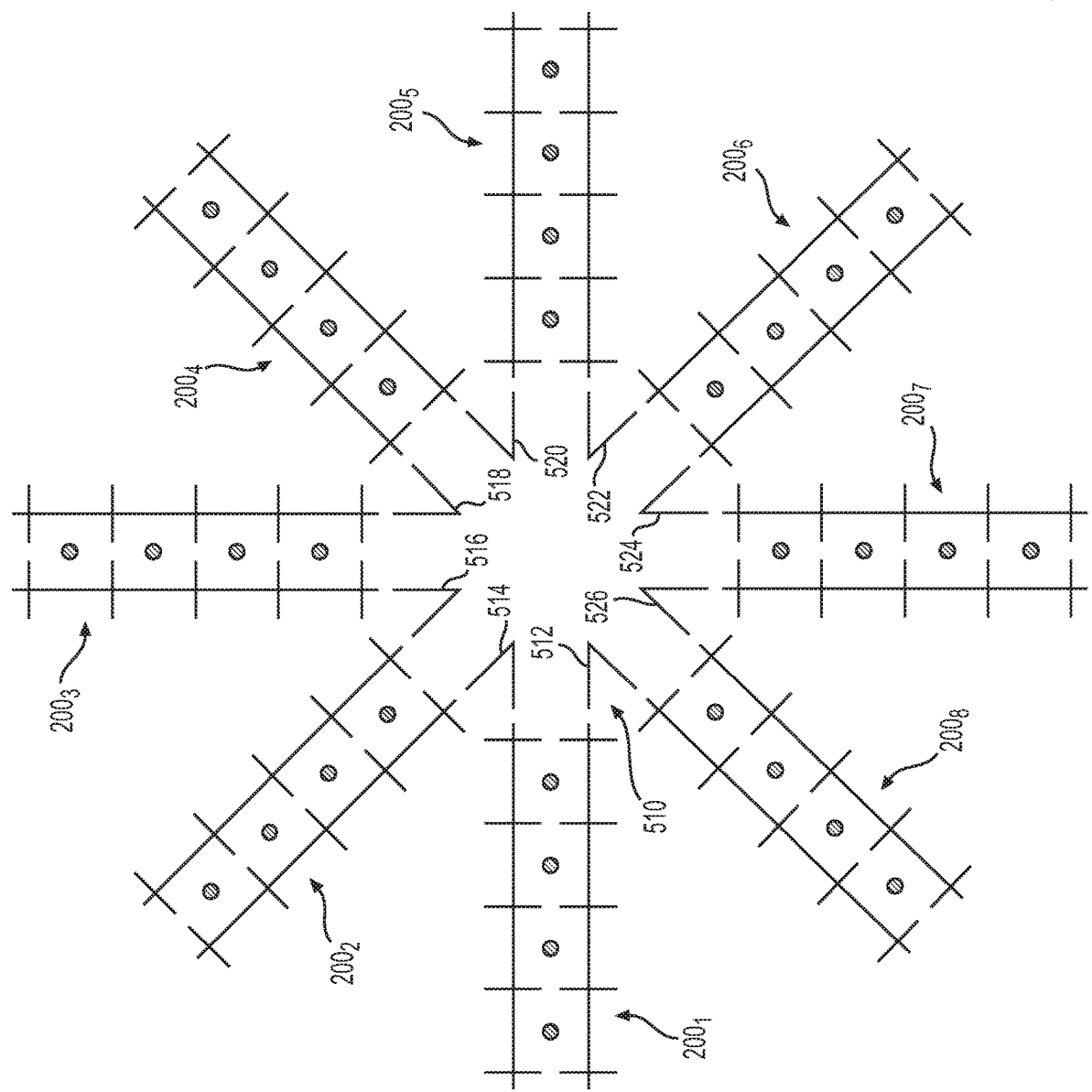
FIG. 5 shows a schematic diagram of a memory-cell array having a plurality of memory cells of FIG. 2 linked together according to yet another embodiment.

FIG. 5 shows a schematic diagram of a memory-cell array 500 according to yet another embodiment. Array 500 comprises eight memory cells 200 (FIG. 2), which are labeled in FIG. 5 using the reference numerals $200_1$-$200_8$, respectively. Array 500 further comprises a linker 510 that connects memory cells $200_1$-$200_8$ such that (i) the filling factor of 5/2 is continuous throughout memory cells $200_1$-$200_8$ and linker 510 and (ii) the charges can move coherently along the edges of the 2DCCG droplet laterally confined within memory cells $200_1$-$200_8$ and linker 510.

In an example embodiment, linker 510 can be implemented using (i) a quantum-well structure similar to that of memory cell 200 and (ii) electrodes 512-526 configured to laterally confine the portion of the 2DCCG droplet located in the linker. Electrodes 512-526 can be similar, e.g., to electrodes T' and/or B' of memory cell 10 or 200. Due to the presence of linker 510, the qubits $|m_1>, \ldots, |m_8>$ supported in memory cells $200_1$-$200_8$, respectively, can be entangled such that array 500 can support the corresponding entangled quantum state.

The geometric arrangement of memory cells $200_1$-$200_8$ and linker 510 in array 500 can be illustratively analogized to a eight-spoke wheel, wherein linker 510 is geometrically similar to the wheel's axle, and memory cells $200_1$-$200_8$ are geometrically similar to the wheel's eight spokes that extend out from the axle. The angle between two neighboring memory cells 200 in this geometric arrangement is approximately 45 degrees.

In view of FIGS. 4 and 5, a person of ordinary skill in the art will understand how to make and use a memory-cell array having a wheel-and-spokes arrangement of an arbitrary number of memory cells 200, with said arbitrary number being, e.g., in the range from three to sixteen.

Figure 6:
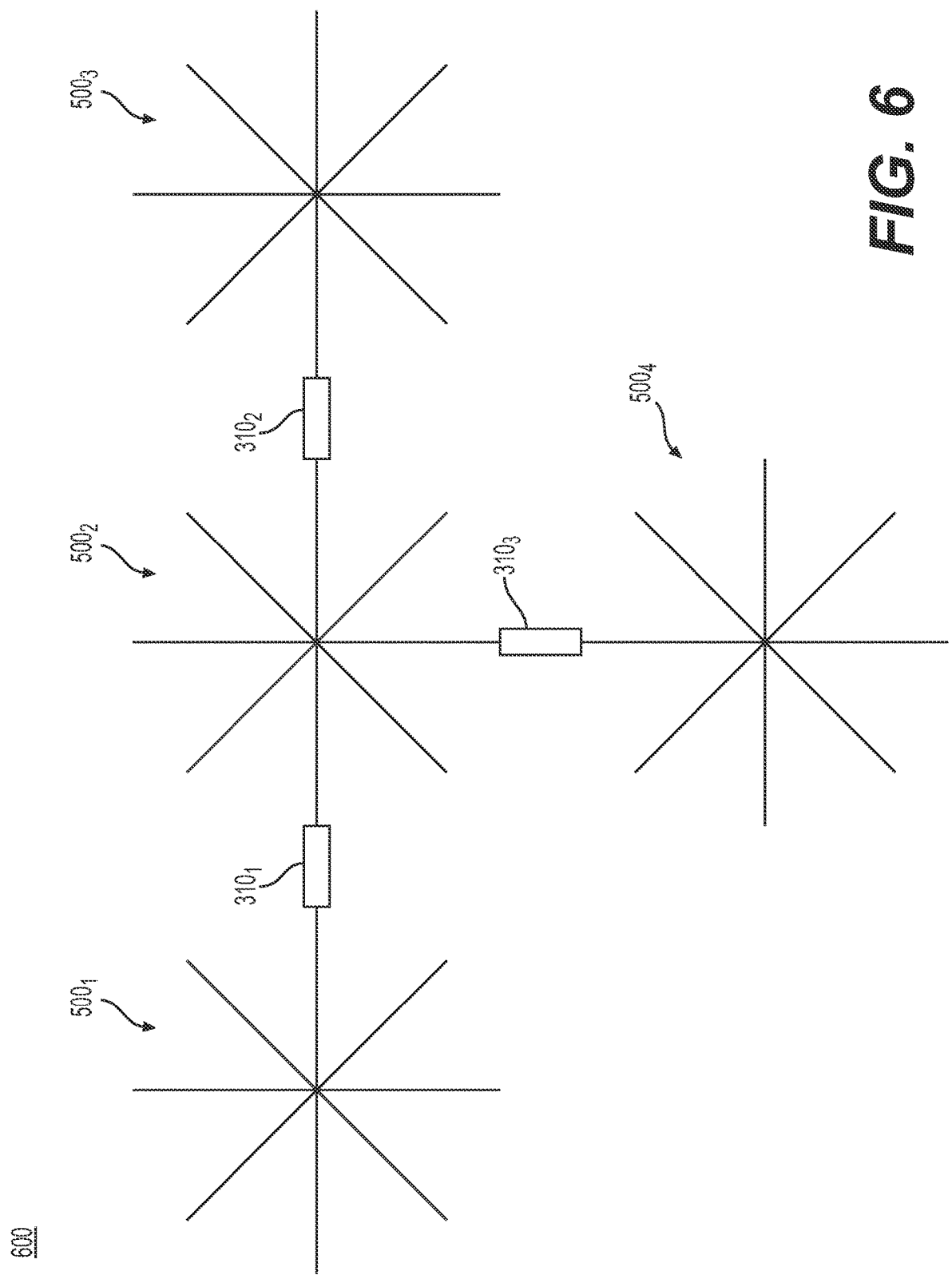
FIG. 6 shows a schematic diagram of a memory-cell array having a plurality of memory cells of FIG. 2 linked together according to yet another embodiment.

FIG. 6 shows a schematic diagram of a memory-cell array 600 according to yet another embodiment. Array 600 comprises four arrays 500 (FIG. 2), which are labeled in FIG. 6 using the reference numerals 500$_1$-500$_4$, respectively. Array 600 further comprises linkers 310$_1$-310$_3$ that interconnect arrays 500$_1$-500$_4$ as indicated in FIG. 6. More specifically, linker 310$_1$ directly connects arrays 500$_1$ and 500$_2$. Linker 310$_2$ directly connects arrays 500$_2$ and 500$_3$. Linker 310$_3$ directly connects arrays 500$_2$ and 500$_4$. The connections are such that (i) the filling factor of 5/2 is continuous throughout arrays 500$_1$-500$_4$ and linkers 310$_1$-310$_3$ and (ii) the charges can move coherently along the edges of the 2DCCG droplet laterally confined within arrays 500$_1$-500$_4$ and linkers 310$_1$-310$_3$.

In view of FIG. 6, a person of ordinary skill in the art will understand how to make and use a memory-cell array having a different number of arrays 500, or a desired number of arrays 400, or a desired number of other suitable arrays comprising memory cells 200.

According to an example embodiment disclosed above, e.g., in the summary section and/or in reference to any one or any combination of some or all of FIGS. 1-6, provided is an apparatus comprising: a substrate having a semiconductor quantum-well structure; a plurality of memory cells (e.g., 200, FIG. 2) on the substrate, each of the memory cells having a first pattern of controllable electrodes on a top surface of the substrate, the electrodes of the first pattern defining four lateral regions (e.g., 1-4, FIG. 2) arranged linearly and joined by intra-cell channels; and one or more memory-cell linkers (e.g., 310, FIGS. 3, 6; 410, FIG. 4; 510, FIGS. 5, 6) on the substrate, each of the memory-cell linkers having a respective second pattern of controllable electrodes on the top surface of the substrate to define a respective inter-cell channel connecting at least two of the memory cells; wherein the electrodes of the first and second patterns are controllable to deplete lateral areas of the quantum-well structure of charge carriers such that a fractional-quantum-Hall-effect droplet of the charge carriers is laterally localized in the semiconductor quantum well structure, with different respective portions of the droplet being localized in each of the memory cells and each of the one or more memory-cell linkers; and wherein the one or more memory-cell linkers includes a first memory-cell linker (e.g., 410, FIG. 4; 510, FIG. 5) configured to directly connect at least three of the memory cells.

According to another example embodiment disclosed above, e.g., in the summary section and/or in reference to any one or any combination of some or all of FIGS. 1-6, provided is an apparatus comprising: a substrate having a semiconductor quantum-well structure; a plurality of memory cells (e.g., 200, FIG. 2) on the substrate, each of the memory cells having a first pattern of controllable electrodes on a top surface of the substrate, the electrodes of the first pattern defining a sequence of four lateral regions (e.g., 1-4, FIG. 2) of the semiconductor quantum-well structure joined by intra-cell channels; and one or more memory-cell linkers (e.g., 410, FIG. 4; 510, FIGS. 5, 6) on the substrate, each of said one or more memory-cell linkers having a respective second pattern of controllable electrodes on the top surface of the substrate to define selectable inter-cell channel connections of at least three of the memory cells; and wherein the electrodes of the first and second patterns are controllable to deplete lateral areas of the quantum-well structure of charge carriers such that a droplet of the charge carriers in the semiconductor quantum-well structure is localized laterally along the top surface, with a respective portion of the droplet being localized in each of the memory cells and in each of the one or more memory-cell linkers.

In some embodiments of the above apparatus, a first of the one or more memory-cell linkers (e.g., 410, FIG. 4) is configurable to directly connect at least four of the memory cells.

According to yet another example embodiment disclosed above, e.g., in the summary section and/or in reference to any one or any combination of some or all of FIGS. 1-6, provided is an apparatus comprising: a substrate having a semiconductor quantum-well structure along a surface thereof; a plurality of memory cells (e.g., 200, FIG. 2) on the substrate, each of the memory cells having a first pattern of controllable electrodes on the surface of the substrate, the electrodes of the first pattern laterally defining a physical sequence of three or more lateral regions (e.g., 1-4, FIG. 2) of the semiconductor quantum-well structure joined by channels; and one or more memory-cell linkers (e.g., 410, FIG. 4; 510, FIGS. 5, 6) on the substrate, each of said one or more memory-cell linkers having a respective second pattern of controllable electrodes on the surface of the substrate; and wherein the electrodes of the first and second patterns are controllable to deplete lateral areas of the quantum-well structure of charge carriers such that a droplet of the charge carriers in the semiconductor quantum-well structure is localized laterally along the surface, the second pattern of controllable electrodes being configurable to confine a portion of the droplet, along the surface, to connect at least three of the memory cells.

In some embodiments of the above apparatus, a first of the one or more memory-cell linkers is configurable to laterally confine, along the surface, a part of the droplet to connect at least four of the memory cells.

In some embodiments of any of the above apparatus, the four memory cells are arranged such that any two laterally adjacent memory cells are oriented at a relative angle of about 90 degrees (e.g., as in FIG. 4).

In some embodiments of any of the above apparatus, a first of the one or more memory-cell linkers (e.g., 510, FIG. 5) is configured to directly connect at least eight of the memory cells.

In some embodiments of any of the above apparatus, a first of the one or more memory-cell linkers (e.g., 510, FIG. 5) is configurable to laterally confine, along the surface, a part of the droplet to connect at least eight of the memory cells.

In some embodiments of any of the above apparatus, the eight memory cells are arranged such that any two laterally adjacent memory cells are oriented at a relative angle of about 45 degrees (e.g., as in FIG. 4).

In some embodiments of any of the above apparatus, each of the one or more memory-cell linkers is configured to support entanglement of a fractional-quantum-Hall-effect state supported in said at least three of the memory cells.

In some embodiments of any of the above apparatus, at least one of the one or more memory-cell linkers is configurable to support entanglement of a fractional-quantum-Hall-effect state of a part of the droplet in said at least three of the memory cells and at least one of the one or more memory-cell linkers.

In some embodiments of any of the above apparatus, the apparatus further comprises an additional memory-cell linker (e.g., 310, FIG. 6) configured to directly connect two of the memory cells.

In some embodiments of any of the above apparatus, the apparatus further comprises an additional memory-cell linker having a third pattern of electrodes configurable to laterally confine, along the surface, a part of the droplet to directly connect two of the memory cells.

In some embodiments of any of the above apparatus, the one or more memory-cell linkers further include a third memory-cell linker (e.g., 510 of 500$_2$, FIG. 6).

In some embodiments of any of the above apparatus, the additional memory-cell linker is configured to directly connect one of the at least three memory cells directly connected to the first memory-cell linker and one of the at least three memory cells directly connected to the third memory-cell linker (e.g., as in FIG. 6).

In some embodiments of any of the above apparatus, the additional memory-cell linker is configurable to laterally confine, along the surface, the part of the droplet to directly connect thereto one of the at least three memory cells.

In some embodiments of any of the above apparatus, said at least three of the memory cells include two memory cells (e.g., 200$_1$ and 200$_2$, FIGS. 4, 5) whose relative orientation is not collinear.

In some embodiments of any of the above apparatus, said at least three of the memory cells include two memory cells (e.g., 200$_1$ and 200$_5$, FIG. 5) whose relative orientation is collinear.

In some embodiments of any of the above apparatus, said at least three of the memory cells include at least three memory cells whose relative orientation is about collinear.

In some embodiments of any of the above apparatus, the electrodes are controllable to perform one or more of the following: store a multi-qubit state on the droplet, while the droplet is maintained in a fractional-quantum-Hall-effect state; read qubit values stored in the memory cells; and do an entanglement computation with said multi-qubit state stored on the droplet.

In some embodiments of any of the above apparatus, the electrodes are controllable to perform two or more of the following: store a multi-qubit state on the droplet, while the droplet is maintained in a fractional-quantum-Hall-effect state; read qubit values stored in the memory cells; and do an entanglement computation with said multi-qubit state stored on the droplet.

In some embodiments of any of the above apparatus, the electrodes are controllable to perform the following: store a multi-qubit state on the droplet, while the droplet is maintained in a fractional-quantum-Hall-effect state; read qubit values stored in the memory cells; and do an entanglement computation with said multi-qubit state stored on the droplet.

While this disclosure includes references to illustrative embodiments, this specification is not intended to be construed in a limiting sense. Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

Throughout the detailed description, the drawings, which are not to scale, are illustrative only and are used in order to explain, rather than limit the disclosure. The use of terms such as height, length, width, top, bottom, is strictly to facilitate the description of the embodiments and is not intended to limit the embodiments to a specific orientation. For example, height does not imply only a vertical rise limitation, but is used to identify one of the three dimensions of a three dimensional structure as shown in the figures. Such "height" would be vertical where the electrodes are horizontal but would be horizontal where the electrodes are vertical, and so on.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. The same type of distinction applies to the use of terms "attached" and "directly attached," as applied to a description of a physical structure. For example, a relatively thin layer of adhesive or other suitable binder can be used to implement such "direct attachment" of the two corresponding components in such physical structure.

The description and drawings merely illustrate the principles of the disclosure. It will thus be appreciated that those of ordinary skill in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

As used in this application, the term "circuitry" may refer to one or more or all of the following: (a) hardware-only circuit implementations (such as implementations in only analog and/or digital circuitry); (b) combinations of hardware circuits and software, such as (as applicable): (i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions); and (c) hardware circuit(s) and or processor(s), such as a microprocessor(s) or a portion of a microprocessor(s), that requires software (e.g., firmware) for operation, but the software may not be present when it is not needed for operation." This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

It should be appreciated by those of ordinary skill in the art that any block diagrams herein represent conceptual views of illustrative circuitry embodying the principles of the disclosure.

As used herein and in the claims, the term "provide" with respect to a system, device, or component encompasses designing or fabricating the system, device, or component; causing the system, device, or component to be designed or fabricated; and/or obtaining the system, device, or component by purchase, lease, rental, or other contractual arrangement.

What is claimed is:

1. An apparatus, comprising:
a planar semiconductor quantum-well structure having layers extending along a top surface thereof;
a plurality of memory cells, each of the memory cells having a first pattern of controllable electrodes over and near the top surface, the electrodes of the first pattern substantially laterally surrounding a corresponding physical sequence of three or more lateral regions of the semiconductor quantum-well structure joined by channels; and
one or more memory-cell linkers configurable to link the memory cells, each of said one or more memory-cell linkers having a respective second pattern of controllable electrodes over and near the top surface; and
wherein the electrodes of the first and second patterns are controllable to deplete underlying lateral areas of the quantum-well structure of charge carriers such that a droplet of the charge carriers in the semiconductor quantum-well structure is localized laterally along the top surface, the electrodes of the one or more second patterns being controllable to confine a portion of the droplet, along the top surface within the one or more memory-cell linkers, to connect at least three of the memory cells; and
wherein at least one of the one or more memory-cell linkers is configurable to support entanglement of a fractional-quantum-Hall-effect state of a part of the droplet in said at least three of the memory cells and the at least one of the one or more memory-cell linkers.

2. The apparatus of claim 1, wherein a first of the one or more memory-cell linkers is configurable to laterally confine, along the top surface, a part of the droplet to connect four of the memory cells.

3. The apparatus of claim 2, wherein the four of the memory cells are arranged such that any two laterally adjacent ones of the four of the memory cells are oriented at a relative angle of about 90 degrees.

4. The apparatus of claim 1, wherein a first of the one or more memory-cell linkers is configurable to laterally confine, along the top surface, a part of the droplet to connect eight of the memory cells.

5. The apparatus of claim 4, wherein the eight of the memory cells are arranged such that any two laterally adjacent ones of the eight of the memory cells are oriented at a relative angle of about 45 degrees.

6. The apparatus of claim 1, further comprising an additional memory-cell linker having a third pattern of electrodes over and near the top surface, the third pattern of electrodes being configurable to laterally confine, along the top surface, a different portion of the droplet to directly connect two of the memory cells.

7. The apparatus of claim 6, wherein the one or more memory-cell linkers further include a third memory-cell linker.

8. The apparatus of claim 6, wherein the additional memory-cell linker is configurable to laterally confine, along the top surface, the different portion of the droplet to directly connect thereto one of the at least three of the memory cells.

9. The apparatus of claim 1, wherein said at least three of the memory cells include two of the memory cells whose orientations are not collinear.

10. The apparatus of claim 9, wherein said at least three of the memory cells include three of the memory cells whose orientations are about collinear.

11. An apparatus comprising:
a planar semiconductor quantum-well structure having layers extending along a top surface thereof;
a plurality of memory cells, each of the memory cells having a first pattern of controllable electrodes over and near the top surface, the electrodes of the first pattern substantially laterally surrounding a corresponding physical sequence of three or more lateral regions of the semiconductor quantum-well structure joined by channels; and
one or more memory-cell linkers configurable to link the memory cells, each of said one or more memory-cell linkers having a respective second pattern of controllable electrodes over and near the top surface; and
wherein the electrodes of the first and second patterns are controllable to deplete underlying lateral areas of the quantum-well structure of charge carriers such that a droplet of the charge carriers in the semiconductor quantum-well structure is localized laterally along the top surface, the electrodes of the one or more of the second patterns being controllable to confine a portion of the droplet, along the top surface within the one or more memory-cell linkers, to connect at least three of the memory cells; and
wherein the electrodes are controllable to perform one or more of the following:
store a multi-qubit state on the droplet, while the droplet is maintained in a fractional-quantum-Hall-effect state;
read qubit values stored in the memory cells; and do an entanglement computation with said multi-qubit state stored on the droplet.

12. The apparatus of claim 11, wherein the electrodes are controllable to perform two or more of the following:
the store of a multi-qubit state on the droplet, while the droplet is maintained in a fractional-quantum-Hall-effect state;
the read of qubit values stored in the memory cells; and
the doing of an entanglement computation with said multi-qubit state stored on the droplet.

13. The apparatus of claim 11, wherein the electrodes are controllable to perform the following:
the store of a multi-qubit state on the droplet, while the droplet is maintained in a fractional-quantum-Hall-effect state;
the read of qubit values stored in the memory cells; and
the doing of an entanglement computation with said multi-qubit state stored on the droplet.

\* \* \* \* \*